United States Patent
Hohlfeld et al.

(10) Patent No.: US 8,298,867 B2
(45) Date of Patent: Oct. 30, 2012

(54) METHOD FOR FABRICATING A CIRCUIT SUBSTRATE ASSEMBLY AND A POWER ELECTRONICS MODULE COMPRISING AN ANCHORING STRUCTURE FOR PRODUCING A CHANGING TEMPERATURE-STABLE SOLDER BOND

(75) Inventors: Olaf Hohlfeld, Warstein (DE); Jens Goerlich, Bueren (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 142 days.

(21) Appl. No.: 12/850,374

(22) Filed: Aug. 4, 2010

(65) Prior Publication Data

US 2011/0053319 A1 Mar. 3, 2011

(30) Foreign Application Priority Data

Aug. 7, 2009 (DE) .................. 10 2009 028 360

(51) Int. Cl.
*H01L 21/00* (2006.01)
(52) U.S. Cl. ................. 438/122; 257/E23.141
(58) Field of Classification Search .................. 438/121, 438/122; 257/E23.141
See application file for complete search history.

(56) References Cited

U.S. PATENT DOCUMENTS

| | | | | |
|---|---|---|---|---|
| 6,406,636 | B1 * | 6/2002 | Vaganov | 216/2 |
| 7,215,013 | B2 * | 5/2007 | Nozu | 257/676 |
| 7,928,563 | B2 * | 4/2011 | Bakir et al. | 257/713 |
| 2005/0270744 | A1 * | 12/2005 | Farrow et al. | 361/704 |
| 2008/0093729 | A1 * | 4/2008 | Siepe et al. | 257/703 |
| 2008/0230905 | A1 | 9/2008 | Guth et al. | |
| 2009/0243089 | A1 | 10/2009 | Hohlfeld et al. | |

* cited by examiner

*Primary Examiner* — Shaun Campbell
(74) *Attorney, Agent, or Firm* — Murphy, Bilak & Homiller, PLLC

(57) ABSTRACT

A power semiconductor module is fabricated by providing a circuit substrate with a metal surface and an insulating substrate comprising an insulation carrier featuring a bottom side provided with a bottom metallization layer. An anchoring structure is provided comprising a plurality of oblong pillars each featuring a first end facing away from the insulation carrier, at least a subset of the pillars being distributed over the anchoring structure in its entirety, it applying for each of the pillars of the subset that from a sidewall thereof no or a maximum of three elongated bonding webs each extend to a sidewall of another pillar where they are bonded thereto. The anchoring structure is positioned between the insulation carrier and metal surface, after which the metal surface is soldered to the bottom metallization layer and anchoring structure by means of a solder packing all interstices between the metal surface and bottom metallization layer with the solder.

24 Claims, 13 Drawing Sheets

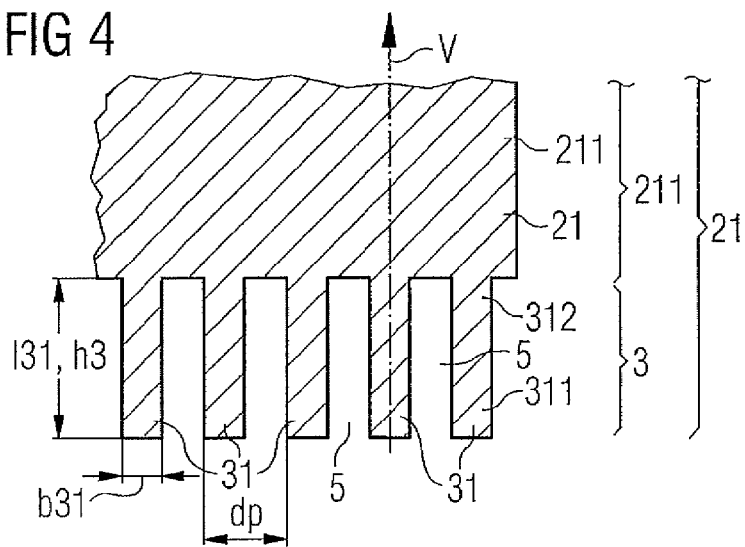
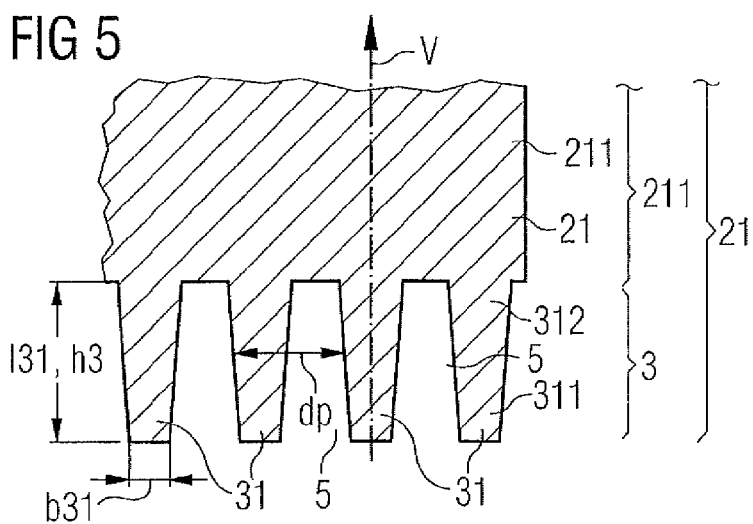
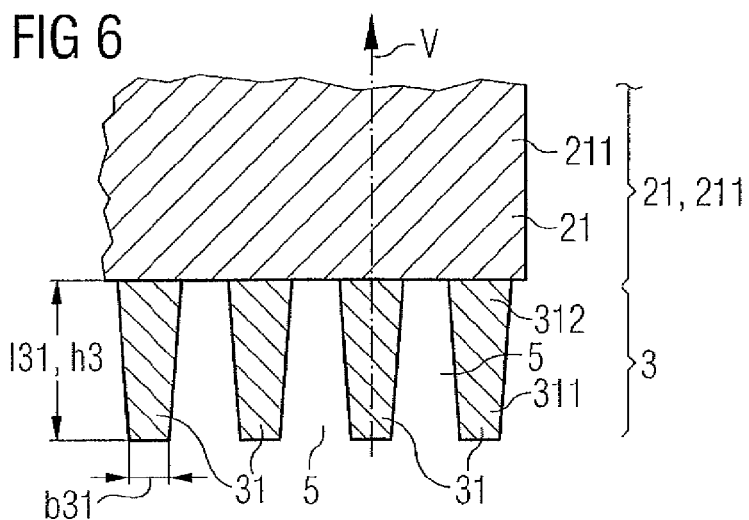

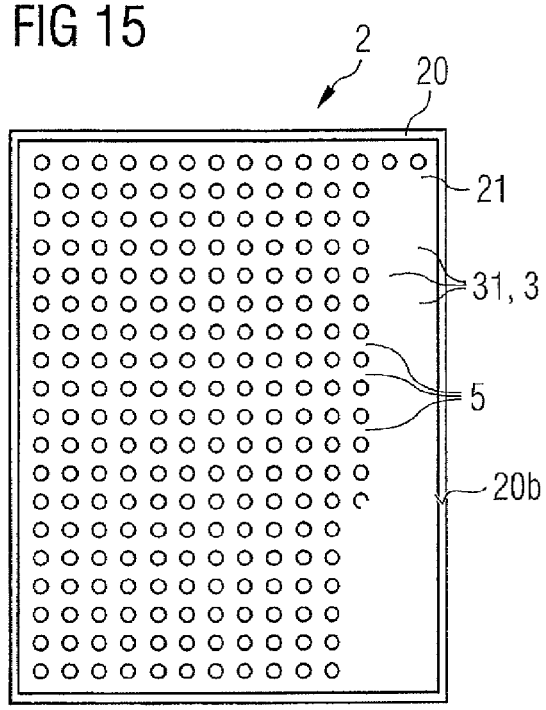
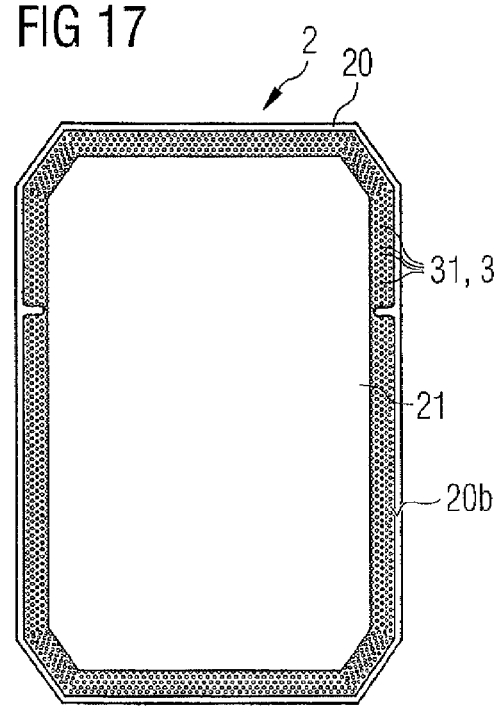
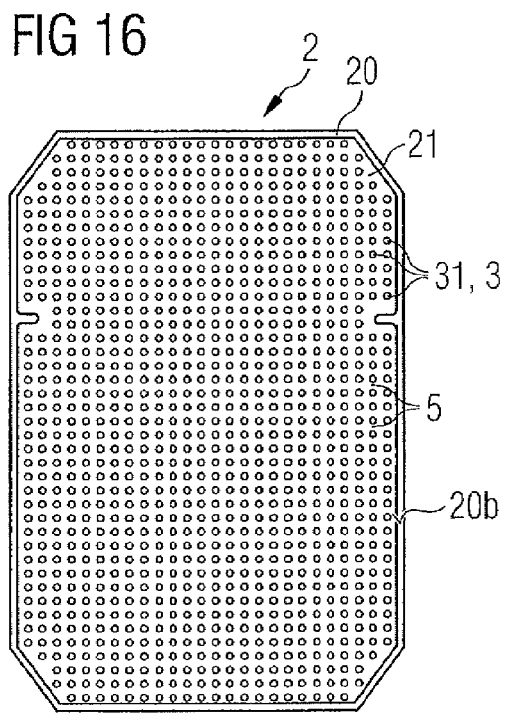
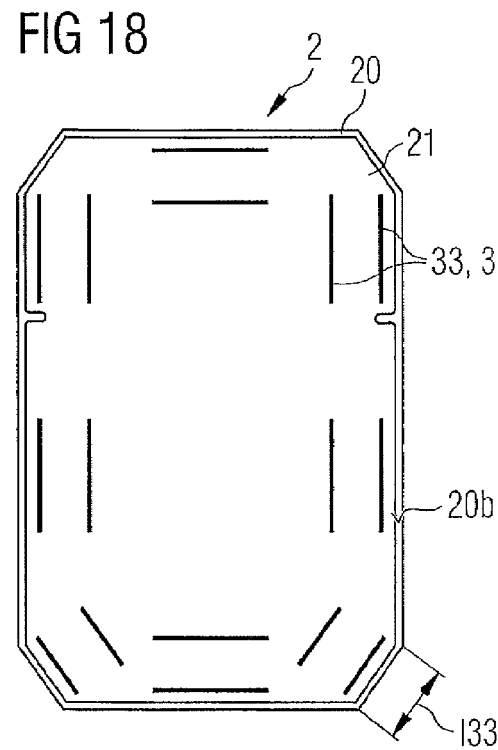

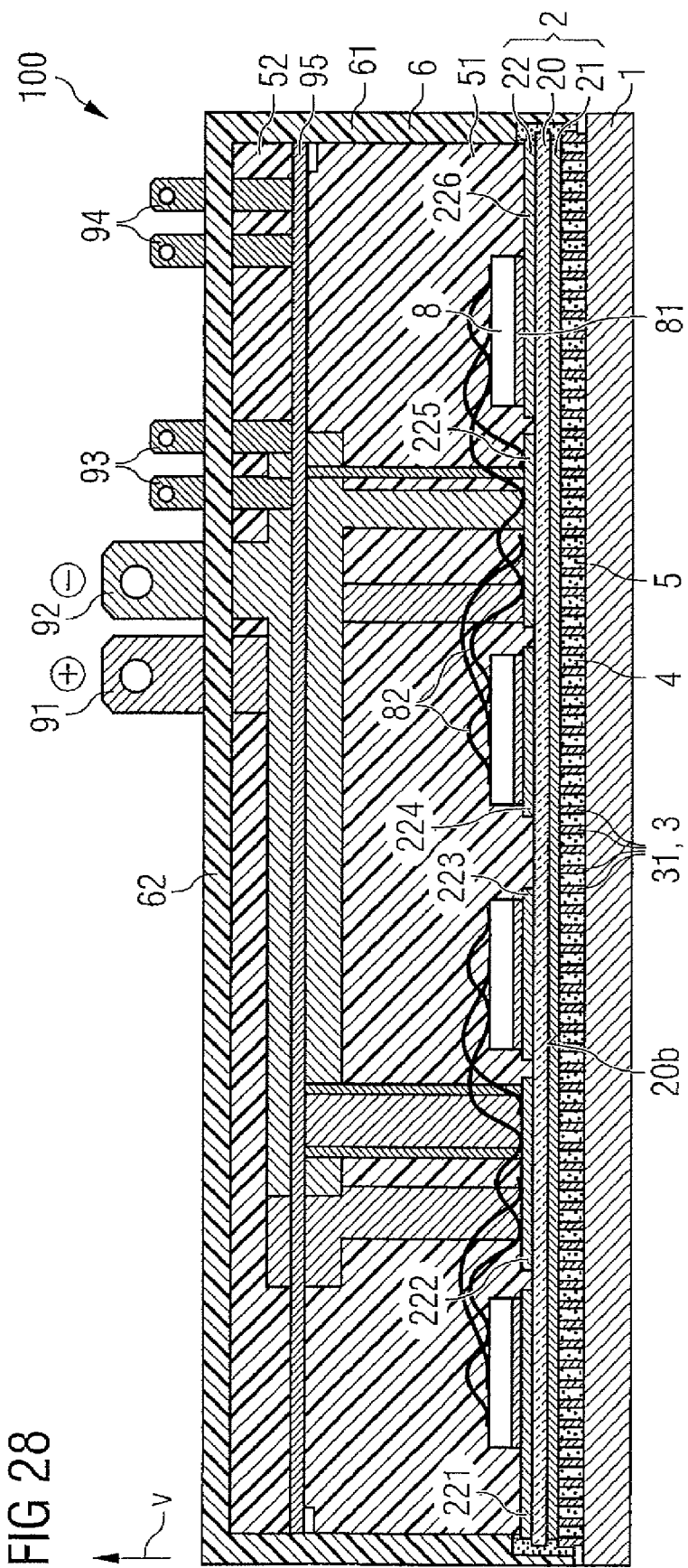

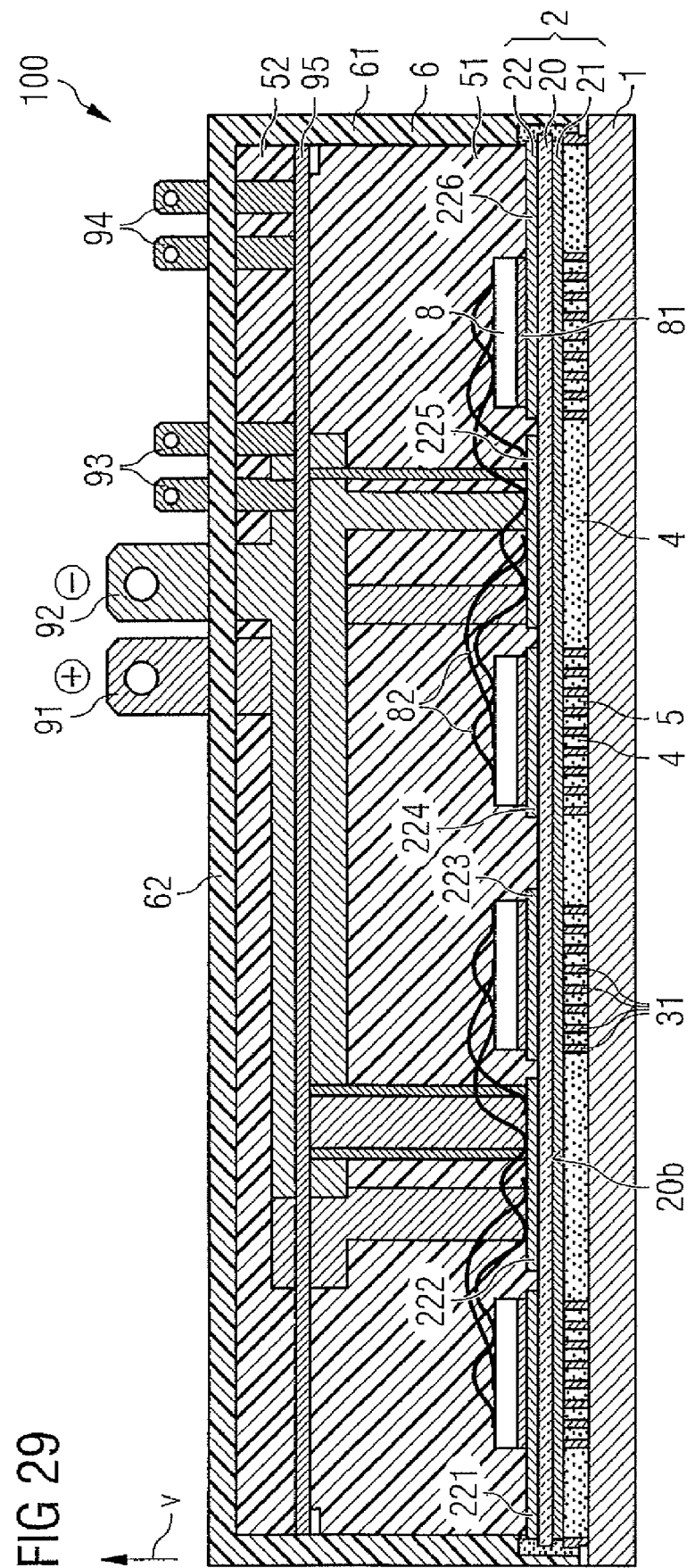

METHOD FOR FABRICATING A CIRCUIT SUBSTRATE ASSEMBLY AND A POWER ELECTRONICS MODULE COMPRISING AN ANCHORING STRUCTURE FOR PRODUCING A CHANGING TEMPERATURE-STABLE SOLDER BOND

PRIORITY CLAIM

This application claims priority from German Patent Application No. 10 2009 028 360.9-33, which was filed on 7 Aug. 2009, said German Patent Application incorporated herein by reference in its entirety.

FIELD OF TECHNOLOGY

The invention relates to circuit substrate assemblies.

BACKGROUND

Circuit substrate assemblies are widely used, for example, in power electronics modules (PEMs). Power electronics modules are semiconductor modules used in power electronics circuitry. Power electronics modules are employed typically in vehicular, rail and industrial applications, for example in inverters or rectifiers. They likewise find application in the form of energy generation and transmission. The semiconductor components contained in the power electronics modules may involve e.g. semiconductor chips including an insulated gate (IGBT) or metal oxide field-effect transistor (MOSFET). These IGBT and MOSFET semiconductor chips vary as to their voltage and current handling capacity. Some power electronics modules also comprise in the semiconductor assembly additional semiconductor diodes (i.e. flywheel diodes) for overvoltage protection. Such semiconductor chips may likewise comprise thyristors, diodes or any other power components.

For mounting and circuiting semiconductor chips flat ceramic-based insulating substrates are employed metallized on one or both sides. As compared to mounting the semiconductor chip on a mainly metallic circuit substrate a few millimeters thick, mounting it on such an insulating substrate has the advantage of achieving a relatively good stability to changing temperatures since the thermal coefficient of expansion of a ceramic differs less from the thermal coefficient of expansion of a semiconductor chip (approx. 2 ppm) than that of metal. A further advantage involves the dielectric strength of the ceramic coupled with good thermal conductivity.

However, the thermal conductivity of ceramics is less than that of metals. This is why relatively thin ceramic-based insulating substrates are strived for, but the mechanical bending load capacity of which is low. Such ceramic-based insulating substrates are thus often mounted on rugged baseplates, for example, copper or aluminum based metal plates.

One aspect of the present invention is to provide a method for fabricating a circuit substrate assembly comprising a metallic baseplate bonded to a ceramic substrate stable to changing temperatures. A further aspect is to provide a method for fabricating a power semiconductor module including such a circuit substrate assembly.

SUMMARY

In a method for fabricating a substrate assembly a metallized circuit substrate, an insulating substrate and an anchoring structure are provided. The insulating substrate features an insulator with a bottom metallization. The anchoring structure features a plurality of oblong pillars comprising a first end facing away from the insulator, at least a subset of these oblong pillars being distributed over the entire anchoring structure. In addition, each of this subset of oblong pillars features none or maximum three oblong connecting webs jutting out from the sidewalls and each extending towards a sidewall of another oblong pillar where they are connected thereto. After being made available, the anchoring structure is positioned between the insulator and the metallization, after which the metal surface is bonded by means of a solder to the bottom metallization and the anchoring structure, packing all interstices between the metal surface and the bottom metallization with the solder.

The anchoring structure in comprises a plurality of slim long pillars on a regular or irregular spacing distributed over the anchoring structure. The anchoring structure is integrated in the hitherto usual soft solder layers between circuit substrate and may be, for example, between the insulator and the metal surface of the circuit substrate, the metal surface then being bonded to the metallization as well as to the anchoring structure by means of a solder.

The function of the anchoring structure is to distribute the mechanical stress over the full thickness of the solder layer. For the geometry of the metallization in each case (semiconductor assembly, circuit substrate size, shape and material of the baseplate) the anchoring structure is optimized so that the mechanical stress is correspondingly distributed and reduced. To avoid pinholes in the interstices of the anchoring structure vacuum soldering is given preference. Preferably the substrates with their top metallization are componented with the power semiconductors and then soldered to the baseplate. The anchoring structure may be a component of, or independent of, the metallization by it being configured in one piece with the metallization or it may be an element independent of the metallization that is then bonded to the metallization.

By using a plurality of slim long pillars connected between their side surfaces by no or just a maximum of three ridges to the side surfaces of adjoining pillars the anchoring structure as employed in the present invention as compared to the pitted structure known from U.S. Ser. No. 12/059,188 and DE 10 2009 002 065 has a much higher lateral flexibility, i.e. the pillars when subjected to thermomechanical stress react highly flexible laterally to the longitudinal direction of the pillars. This applies particularly also after soldering the bottom substrate metallization to the metal surface of the circuit substrate.

Since the mechanical stress occurs in the layer bonding the insulator to the circuit substrate (e.g. a baseplate) in the interface between the bottom metallization and the solder, i.e. where the thermomechanical stress is a maximum, it is an advantage when the strength of the anchoring structure connecting the insulator is higher than the strength of a conventional soft solder. Achieving such a high-strength bonding of the anchoring structure to the insulator is possible, for example, by soldering an anchoring structure initially independent of the bottom substrate metallization by means of a thin layer of solder permitting the formation of intermetallic phases to the bottom substrate metallization. Another possibility would be to bond the anchoring structure initially independent of the bottom substrate metallization by means of a low-temperature joining technique (LTJT) to the bottom substrate metallization.

Yet another possibility on bonding the anchoring structure to the insulator with high strength is to create the anchoring structure and the bottom substrate metallization in one piece of the same material, for example by embossing or etching.

At the interface between anchoring structure and metal surface of the circuit substrate there is no need to bond the anchoring structure with high strength because this location is not exposed to any thermally triggered differences in expansion.

One such circuit substrate assembly is produced in the method for fabricating a power semiconductor module whereby the insulator is topped opposite its bottom side by a metallization mounting at least one power semiconductor chip. Fabricated in addition is a module package housing the power semiconductor chip and the insulator, in which the circuit substrate forms a baseplate for the power semiconductor module.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 4 is a vertical section through an assembly differing from that as shown in FIG. 2 in that the bottom metallization of the cross-sectional is now configured in one piece with the anchoring structure;

FIG. 5 is a vertical section through an assembly differing from that as shown in FIG. 4 in that the pillars are now tapered towards their free end;

FIG. 6 is a vertical section through an assembly differing from that as shown in FIG. 5 in that the bottom metallization of the ceramic substrate is now configured in one piece with the anchoring structure;

FIG. 15 is a top-down view of the bottom side of a ceramic substrate provided with an anchoring structure as shown in FIG. 4;

FIG. 16 is a top-down view of the bottom side of a further ceramic substrate provided with an anchoring structure featuring slanted corners;

FIG. 17 is a top-down view of the bottom side of yet another ceramic substrate provided as shown in FIG. 2 in which the anchoring structure now runs only along an edge portion of the ceramic substrate;

FIG. 18 is a top-down view of the bottom side of a ceramic substrate provided with longitudinal ribs;

FIG. 28 is a vertical section through a power semiconductor module including a circuit substrate incorporating an insulator, the bottom metallization of which is bonded to a metallic baseplate, an anchoring structure being disposed between the insulator and the baseplate; and FIG. 29 is a vertical section through a power semiconductor module the same as the power semiconductor module as shown in FIG. 26 except that now the anchoring structure is arranged just locally below the power semiconductor chips.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
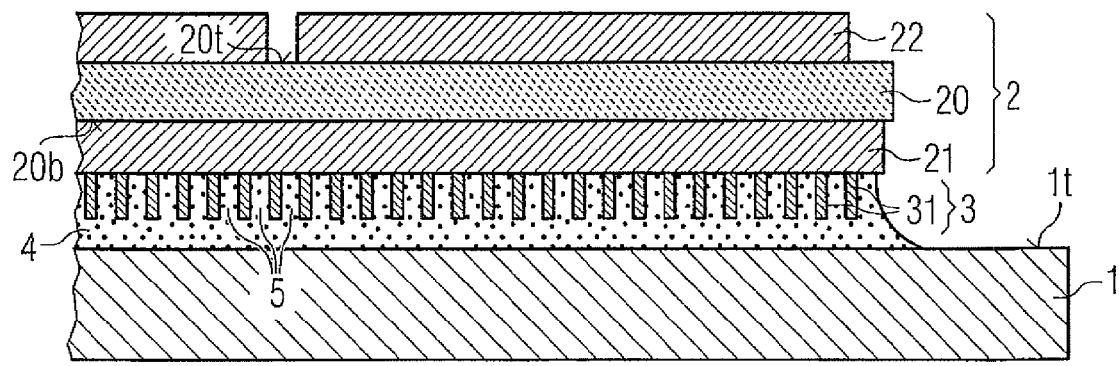
FIG. 1 is a vertical section through an assembly including a metal plate to which a ceramic substrate is secured by means of an anchoring structure comprising a plurality of oblong pillars

Referring now to FIG. 1 there is illustrated a vertical section through an assembly comprising an insulating substrate 2 soldered by means of an anchoring structure 3 to a metallic circuit substrate 1, for instance a metal plate or heatsink. For this purpose the metallic substrate 1 may comprise a metal surface It configured flat or concave. When the circuit substrate is configured as a metallic baseplate for a power semiconductor module even a very slight convex curvature of the baseplate serves with application of an interjected thermal compound to spread the contact pressure to the heatsink more evenly in thus minimizing the heat transfer resistance when mounting the heatsink on the baseplate. Instead of a purely metallic substrate 1 any other kind of circuit substrate, may be employed which when comprising a solderable surface metallization is bonded by at least one side to the insulating substrate 2. Where the circuit substrate is configured as a heatsink it may featuring cooling fins and/or cooling passages for receiving a liquid coolant. Possible cooling methods include fluid cooling, for example with air or a liquid coolant, or evaporation cooling. The circuit substrate 1 may also be made of a material with good thermal conductivity such as, for example, copper or aluminum or an alloy with at least one of these metals or one such metal comprising such an alloy.

The insulating substrate 2 comprises an insulation carrier 20 configured as a pad topped by a top metallization layer 22 as its side, designated top side 20$t$ and bottomed by a bottom metallization layer 21 at its opposite side designated bottom side 20$b$. The top metallization layer 22 is patterned into tracks and/or pads to which one or more electronic components such as e.g. power semiconductor chips are secured to the insulating substrate 2 where applicable intercircuited. The bottom metallization layer 21 is configured as a non-patterned metallization layer, but which, where applicable, may also be patterned.

The metallizations 21 and 22 are solidly bonded to the bottom side 20$b$ and top side 20$t$ respectively of the insulation carrier 20 which may be, for example, a suitable ceramic material such as aluminum nitride (AlN), aluminum oxide (Al2O3), silicon nitride (Si3N4), silicon carbide (SiC) or beryllium oxide (BeO), for instance. The metallizations 21 and 22 are made of copper. The insulating substrate 2 may be, for example, a direct copper bonded (DBS) or active metal brazed (AMB) substrate.

Optionally the metallizations 21 and/or 22 and/or the anchoring structure 3 may be further coated with the materials silver, NiAu, NiPd, NiPdAu to produce a solderable surface or to facilitate topping the chips with NTV. The contact surface area It of the circuit substrate 1 may be plated with a further coating of at least one of the materials nickel, silver, gold, palladium or copper and combinations thereof to produce solderable surfaces. These coatings may be created e.g. by electroplating, sputtered or vapour deposition. If the anchoring structure 3 is included separately in the solder 4 the bottom metallization layer 21 must feature a sheer copper surface at its side facing away from the insulation carrier 20 and/or side of the anchoring structure 3 facing the insulation carrier 20 so that an alloy of Sn and Cu can form between the anchoring structure 3 and the bottom metallization layer 21 during soldering to bond the anchoring structure 3 and bottom metallization layer 21 additionally solid. This alloy must be configured at least in partial areas full-length vertical between the anchoring structure 3 and the bottom metallization layer 21. Optionally or alternatively instead of two surfaces to be soldered together being of sheer copper, one of the surfaces may be silver coated to form Sn—Cu, Sn—Cu—Ag and/or SnAg alloys can form to the same effect.

The anchoring structure 3 comprises a plurality of interstices 5 configured between a plurality of oblong pillars 31 and which before soldering the anchoring structure 3 to the circuit substrate 1 are free of solid-state materials. The oblong pillars 31 and the interstices 5 are distributed throughout the anchoring structure 3.

To solder the insulating substrate 2 and the anchoring structure 3 to the circuit substrate 1 use is made of a solder 4 which during soldering becomes molten to enter and pack the interstices 5. To minimize pinholing, use is made of a vacuum soldering process. Soldering free of pinholes, like soldering without an anchoring structure is necessary to ensure a fully comprehensive thermal resistance. The solder temperature to which the solder 4 is heated may range, for example, from 240° C. to 400° C., e.g. at 260° C., 330° C. or 350° C.

In this arrangement the amount of solder used is scaled slightly more than the volume needed to fully pack all interstices 5. This avoids making the spacing between the anchoring structure 3 and the metal surface It of the circuit substrate 1 unnecessarily large but still sufficient to compensate the tolerances as to the thicknesses and irregularities of the components being soldered. Using the method as explained with reference to FIG. 7 and the surface quality as explained in soldering a separately included anchoring structure results in the flow of solder penetrating the gap between the bottom side of the bottom metallization layer 21 facing the anchoring structure 3 and top surface of anchoring structure 3 facing the anchoring structure 3 by a capillary action to become converted into a thin alloy layer in the region of the gap.

The anchoring structure 3 serves, among other things, to absorb the thermomechanical stress in the solder 4 by vertical distribution in the solder in thus preventing the solder 4 from becoming detached particularly at the interface between the bottom side of the bottom metallization layer 21 and the solder by the forces no longer becoming concentrated at the interface in the corner regions of the solder layer as strongly as in a conventional solder bond.

Figure 2:
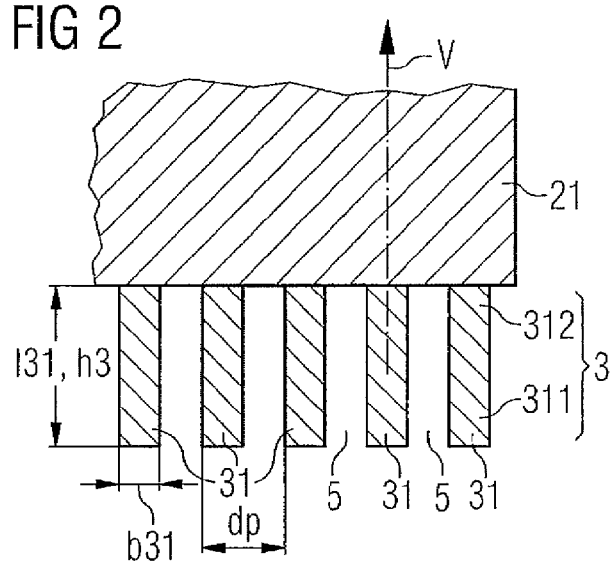
FIG. 2 is a vertical section through the bottom metallization of the ceramic substrate as shown in FIG. 1 and the anchoring structure secured thereto prior to the ceramic substrate being soldered to the metal plate.

Referring now to FIG. 2 there is illustrated a magnified detail of a vertical section through the bottom metallization layer 21 from the corner portion of the insulating substrate 2 as shown in FIG. 1 and the anchoring structure 3 secured to said bottom metallization layer 21, i.e. before soldering the insulating substrate 2 to the circuit substrate 1 as shown in FIG. 1. Each of the pillars 31 extends in a longitudinal centerline v at right angles to the bottom side 20$b$ of the insulation carrier 20 (see FIG. circuit substrate 1). In their longitudinal centerline v the pillars 31 range in a length l31 from, for example, 200 μm to 5 mm identical to the height h3 of the anchoring structure 3, as well as a width or diameter width b31 ranging, for example, from 350 μm to 1 mm at right angles to their longitudinal centerline v, i.e. parallel to the bottom side 20$b$ of the insulation carrier 20. The pillars 31 may in addition feature a repetition spacing (periodicity) dp ranging from, for example, 200 μm to 10 mm in at least one direction parallel to the bottom side 20$b$ of the insulation carrier 20. In this arrangement maximizing the height and minimizing the diameter of the pillar 31 is strived for, since this achieves the best distribution of the mechanical stress in the solder, from which the spacing of the pillars 31 depends in being subject only to limitations in their fabrication as regards the aspect ratio. In all embodiments of the present invention, the anchoring structure 3 may comprise pillars 31 at least in the corner region of the bottom metallization layer 21 and/or along the side edge of the bottom metallization layer 21.

Figure 3:
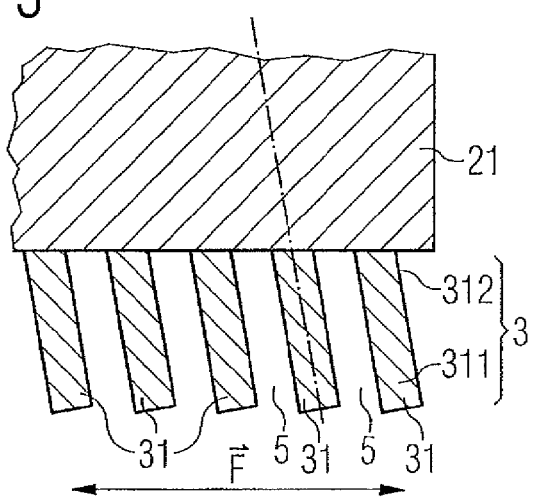
FIG. 3 is a view of the assembly as shown in FIG. 2 but with the anchoring structure subjected to transverse stress.

Referring now to FIG. 3 there is illustrated diagrammatically how the pillars 31 flex sideways when subjected to a force F acting at right angles to the longitudinal centerline v.

Each of the pillars 31 comprises two ends 311 and 312 spaced away from each other in the longitudinal centerline v. Whilst the ends 311 are free, the ends 312 are solidly bonded to the bottom metallization layer 21. Suitable bonding techniques for producing the bond between the anchoring structure 3 and the bottom metallization layer 21 include, for example, soldering at a temperature of maximum 400° C. or pressure sintering at maximum 230° C. by applying a silver solder paste to the bottom metallization layer 21 and/or the anchoring structure 3 and bonding it in a temperature/pressure process. In solder bonding the completed solder layer may mainly comprise at least one intermetallic phase and portions fully extending between the anchoring structure 3 and the bottom metallization layer 21 fully consisting of at least one intermetallic phase. Between the bottom metallization layer 21 and the anchoring structure 3 such a solder layer may also be comprise a fully alloyed portion insulating substrate 2 μm to 30 μm thick, for example.

The bottom metallization layer 21 and anchoring structure 3 are then compressed together. The insulating substrate 2 connected to the anchoring structure 3 can then be soldered to the circuit substrate 1, i.e. the anchoring structure 3 is firstly produced independent of the bottom metallization layer 21. To facilitate handling the independent anchoring structure 3 before bonding the bottom metallization layer 21 it is expedient to interconnect the individual oblong pillars 31 (existing but not shown in the FIGS. 1 to 3) by connecting webs oriented transversely to the longitudinal centerline v. The bonding webs are preferably not as tall as the pillars 31 and configured as willowy as possible so that the mechanical coupling between adjoining pillars 31 is not excessive.

Referring now to FIG. 4 there is illustrated how in an alternative aspect an anchoring structure 3 may also be configured in one piece with the bottom metallization layer 21 of a circuit substrate by the anchoring structure 3 being created by patterning a bottom metallization layer 21 already bonded to the top side 20t of an insulation carrier 20 (as shown in FIG. 1) at its side facing away from the insulation carrier 20. Suitable for achieving this is, for example, masked etching the side of the bottom metallization layer 21 facing away from the insulation carrier 20.

Etched production of an anchoring structure 3 may be done, for example, so that a metal layer of constant thickness ranging from e.g. 400 μm to 1 mm is applied to a flat bottom side 20b of an insulation carrier 20, after which an anchoring structure 3 is created by masked etching hollows, the depth of which can vary between e.g. 200 m and 700 m. When this result in an anchoring structure 3 having oblong pillar 31, their length l31 is identical to the etching depth. In accordance with one example the metal layer prior to being etched has a constant thickness of 600 μm whilst the length l31 of the pillars 31 created by etching amounts to 300 μm. In an anchoring structure produced by etching the spacing of the pillars 31 may exceed twice the length of the pillar 31 (etching depth) as a result of etching being simultaneously effective both longitudinally and laterally.

As an alternative, a circuit substrate, the bottom metallization layer 21 of which is configured in one piece with an anchoring structure 3, can be produced in that one of the two flat main surface areas of a metalized film for configuring an insulating substrate 2 is patterned and the metalized film then bonded by its non-patterned main surface area to the bottom side 20b of a insulation carrier 20. The metalized film then forms the bottom metallization layer 21 including the anchoring structure 3. Patterning the metalized film initially independent of the insulation carrier 20 can be done for example by masked etching and/or embossing and/or punching.

Referring now to FIG. 5 there is illustrated how, unlike the cylindrical pillars 31 as shown in FIG. 4, the oblong pillars 31 of an anchoring structure 3 are now tapered in the direction of their free ends 311, i.e. the cross-sectional area through the pillar 31 is reduced monotonously or strictly monotonously from the ends 312 in the direction of the free ends 311. Whilst the anchoring structure 3 in the arrangement as shown in FIG. 5 is configured in one piece with the bottom metallization layer 21, in the arrangement as shown in FIG. 6 it is, after production, bonded to the bottom metallization layer 21 as already explained with reference to FIGS. 1 to 3.

Figure 7:
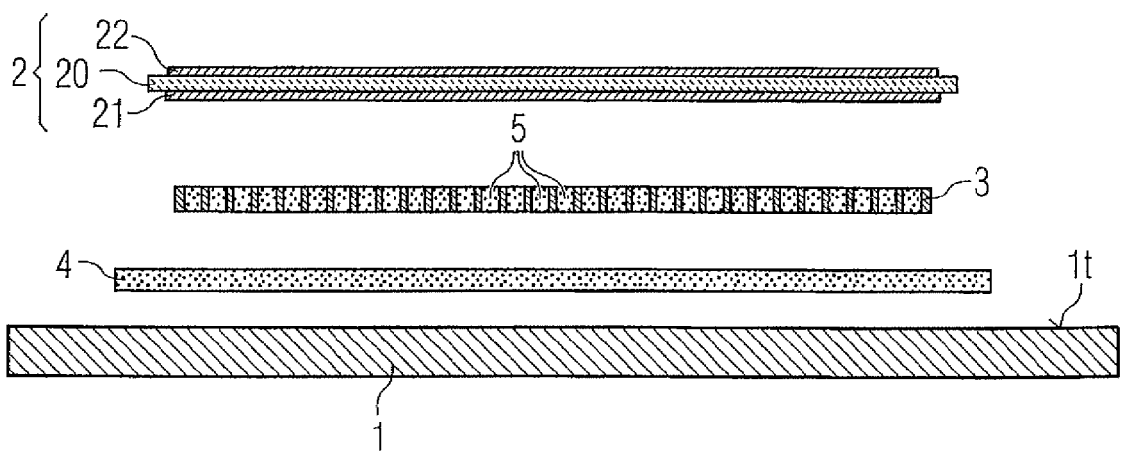
FIG. 7 is an illustration of a step in the fabrication of the assembly as shown in FIG. 1 but showing the anchoring structure disposed between the metallized ceramic substrate and the metal plate as well as a prefabricated solder pad disposed between the anchoring structure and the metal plate.

Referring now to FIG. 7 there is illustrated a method for producing a solder bond between an insulating substrate 2 and a circuit substrate 1, for example a metallic baseplate for a power semiconductor module using an anchoring structure 3 initially independent of the insulating substrate 2. In this arrangement the anchoring structure 3 is positioned between the bottom metallization layer 21 of the insulating substrate 2 and the metal surface It of the circuit substrate 1, after a solder 4 being disposed between the anchoring structure 3 and the metal surface It. The solder can be applied, for example, as a solder pad in an overall thickness ranging from 50 μm to 300 μm to the metal surface It and/or to the bottom side of the anchoring structure 3 facing the metal surface It, or it can top the metal surface It as a prefabricated solder pad. Generally, the thickness is a function of the required solder volume as needed to pack the interstices in the anchoring structure 3. In soldering the insulating substrate 2 and anchoring structure 3 to the metal surface It of the circuit substrate 1 use of the capillary action can be made to urge the molten solder into the anchoring structure 3 fully packing it therewith. Generally the thickness of the applied solder or of the solder pad is scaled so that the interstices are packed to an excess which is dispelled during soldering. Thus, the insulating substrate 2, anchoring structure 3, solder 4 and circuit substrate 1 are each compressed against the other during soldering during which the solder 4 is rendered molten. It is this molten solder 4 which is also urged from below into the interstices 5 and the thin gap between the top of the anchoring structure 3 and the bottom of the bottom metallization layer 21 of the insulating substrate 2 (where such a gap at all exists) packing them full. Once the solder 4 has solidified it forms together with the insulating substrate 2, anchoring structure 3 and circuit substrate 1 a solid composite immune to changes in temperature. Packing the solder into the interstices 5 can be promoted by selecting the width of the interstices 5 so small that the molten solder 4 seeps into the interstices 5 by capillary action. For this purpose each of the interstices 5 may comprise e.g. a width of less than 500 μm in a direction parallel to the bottom side 20b of the insulation carrier 20.

Unless the anchoring structure 3 is not already configured in one piece with the bottom metallization layer 21 of the insulating substrate 2 this capillary action is any case effective for the gap between the top of the anchoring structure 3 facing the insulation carrier 20 and the bottom of the bottom metallization layer 21 facing the anchoring structure because this gap is very thin due to the insulating substrate 2, anchoring structure 3 and circuit substrate 1 being compressed together. It is this very thin gap that during solder makes it possible to configure high-strength intermetallic phases in thus involving a very secure bond between the anchoring structure 3 and the bottom metallization layer 21.

Optionally, the anchoring structure 3 can be surfaced, for example by electroplating, with a solder before producing the solder bond between the insulating substrate 2 and the circuit substrate 1, whereby the bottom metallization layer 21 can be between e.g. 5 µm and 500 µm thick.

In the same way, an assembly can be produced in which the anchoring structure 3 is already solidly bonded to the bottom metallization layer 21, before the insulating substrate 2 is soldered to the circuit substrate 1, or it may be configured in one piece with the bottom metallization layer 21.

Irrespective of how configured, an anchoring structure 3 may be tempered at a temperature exceeding 350° C. before soldering the circuit substrate 1 to the bottom metallization layer 21 to facilitate compensating any deformation of the anchoring structure 3 due to mechanical stress in the finished bonding layer between the bottom metallization layer 21 and the circuit substrate 1.

Figure 8:
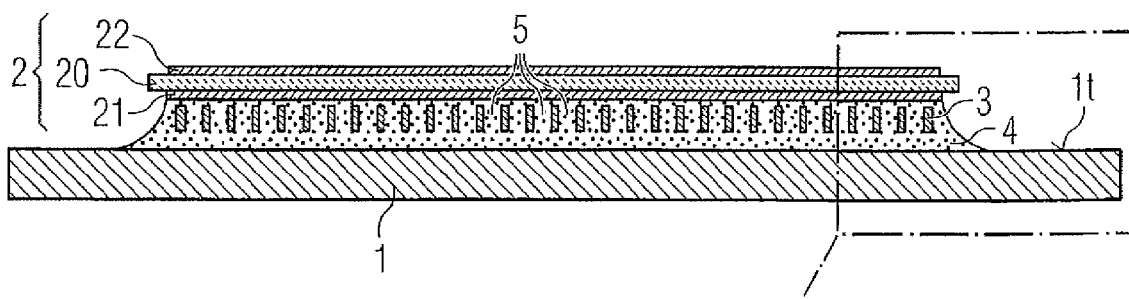
FIG. 8 is a vertical section through the assembly as shown in FIG. 7 but after soldering of the ceramic substrate to the anchoring structure of the metal plate.

Referring now to FIG. 8 there is illustrated the assembly after soldering the insulating substrate 2 to the circuit substrate 1. A magnified detail of the edge portion of this assembly is shown in FIG. 9.

In accordance with another aspect of the invention the density, distribution and geometry of the anchoring structure 3 are set so that the anchoring structure 3 in a section plane E-E' (see FIG. 9) parallel to the bottom side 20b of the insulation carrier 20 comprises a cross-sectional area totalling at least 10% and/or maximum 70% of the surface area of the surface of the bottom metallization layer 21 bonded to the insulation carrier 20.

Figure 9:
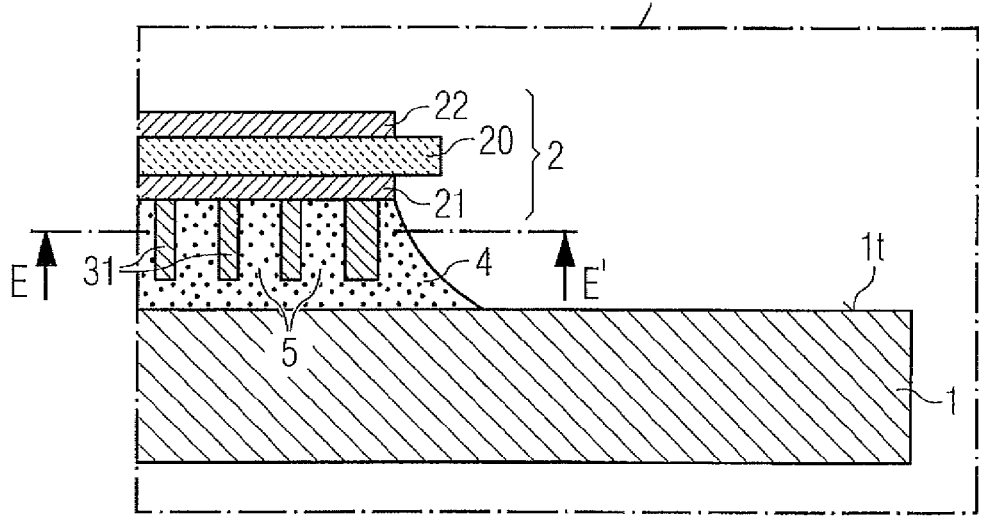
FIG. 9 is a magnified detail of the edge portion of the assembly as shown in FIG. 8.
Figure 10:
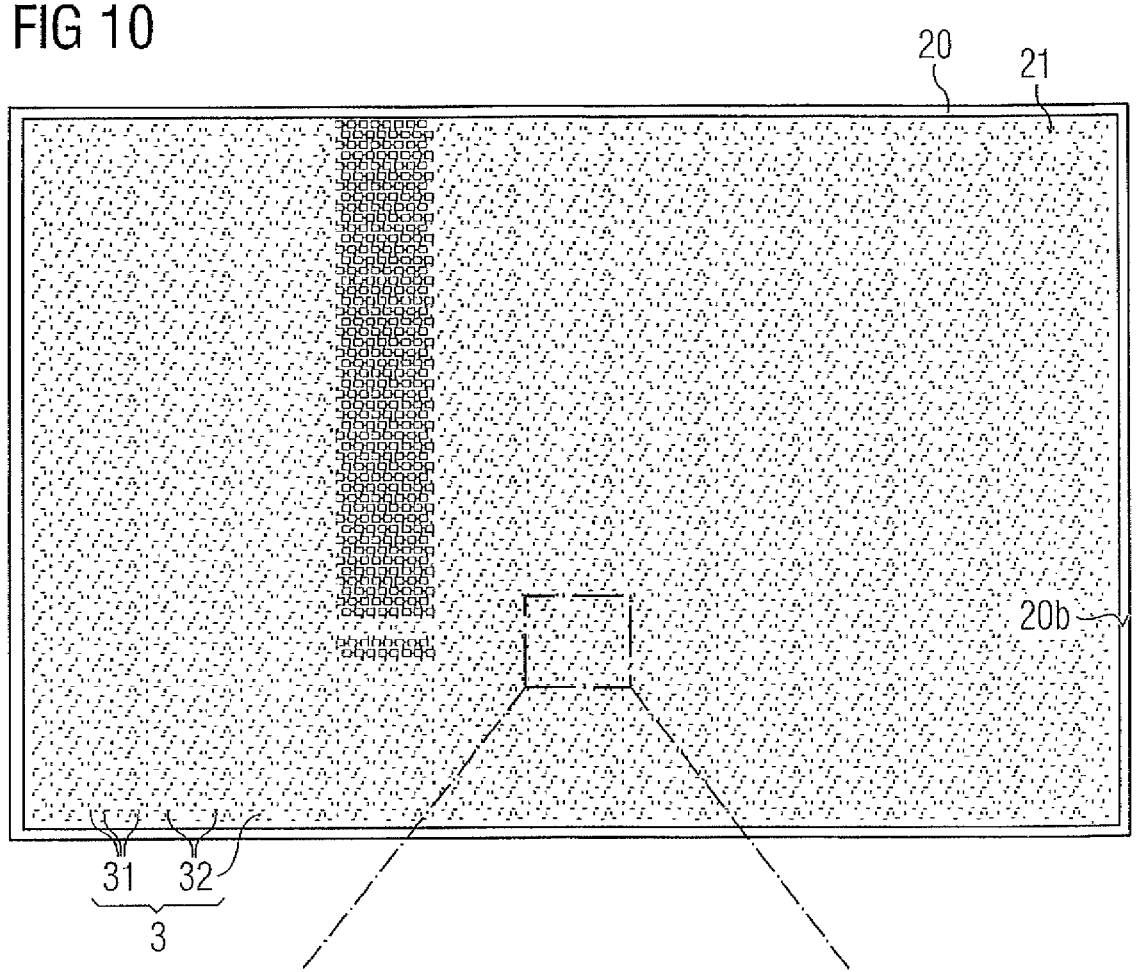
FIG. 10 is a horizontal section through an anchoring structure bonded to an insulator.
Figure 11:
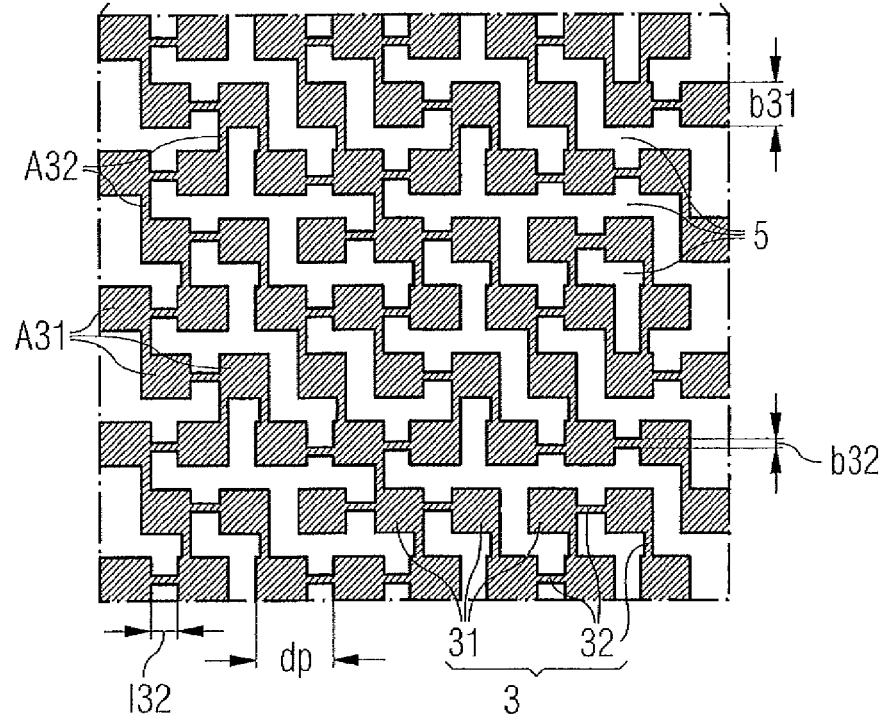
FIG. 11 is a magnified detail of the assembly as shown in FIG. 10.

Referring now to FIG. 10 there is illustrated a horizontal section through an anchoring structure 3 bonded to an insulation carrier 20 in a section plane corresponding to E-E' as shown in FIG. 9 with a view to the bottom side 20b of the insulation carrier 20, whilst FIG. 11 is a magnified detail of this assembly. As evident from FIG. 10 the anchoring structure 3 may extend over the full bottom metallization layer 21.

Referring now to FIGS. 10 and 11 again there is illustrated how the already explained bonding webs 32 are configured between the oblong pillars 31. These pillars 31 comprise a width b31, the webs 32 a width b32 and a length l32 whereby the various pillars 31 may be the same or differ in width b31. Correspondingly the various webs 32 may be the same or differ in width b32 and/or the same or differ in length l32. In this arrangement optionally the width b32 of each web 32 bonded to a bottom metallization layer 21 may be smaller than the width b31 of the corresponding pillar 31.

Optionally, all, or at least a plurality, of the oblong pillars 31 may be each bonded by just precisely four bonding webs 32 or just precisely three bonding webs 32 or just precisely two bonding webs 32 or just precisely by a single bonding webs 32 to one or more adjoining oblong pillars 31. Bonding the pillars 31 and the bonding webs 32 results in the anchoring structure 3 forming a one-part unit for facilitated handling. This is particularly of an advantage when the anchoring structure 3 is bonded to the bottom metallization layer 21 of an insulating substrate 2 not before it having first been produced. In the anchoring structure 3 as shown in FIGS. 10 and 11 the oblong pillars 31 feature square cross-sections. As shown by way of example the pillars 31 may be arranged in rows and/or columns, whereby adjoining rows and/or adjoining columns may be arranged staggered. In addition to this, the bonding webs 32 may be configured as straight webs.

Figure 12:
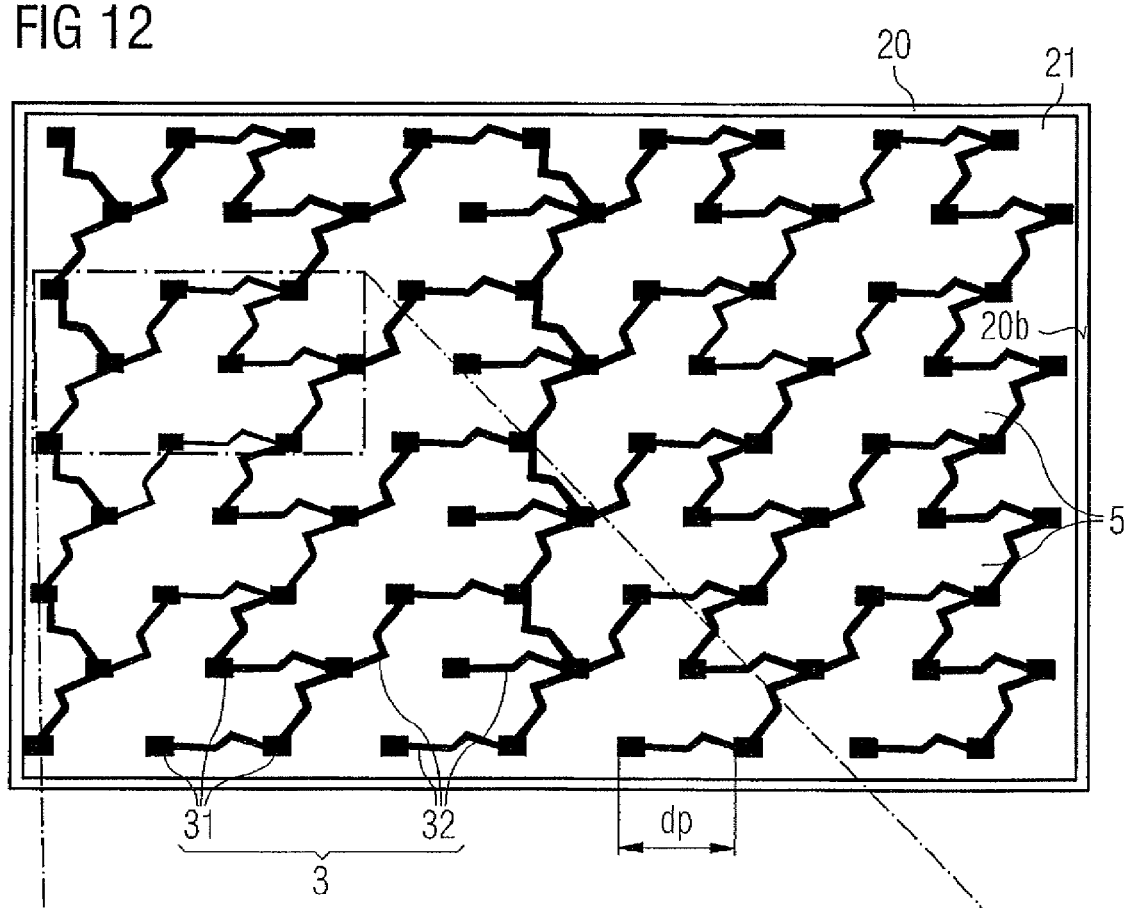
FIG. 12 is a horizontal section through another anchoring structure bonded to the insulator.
Figure 13:
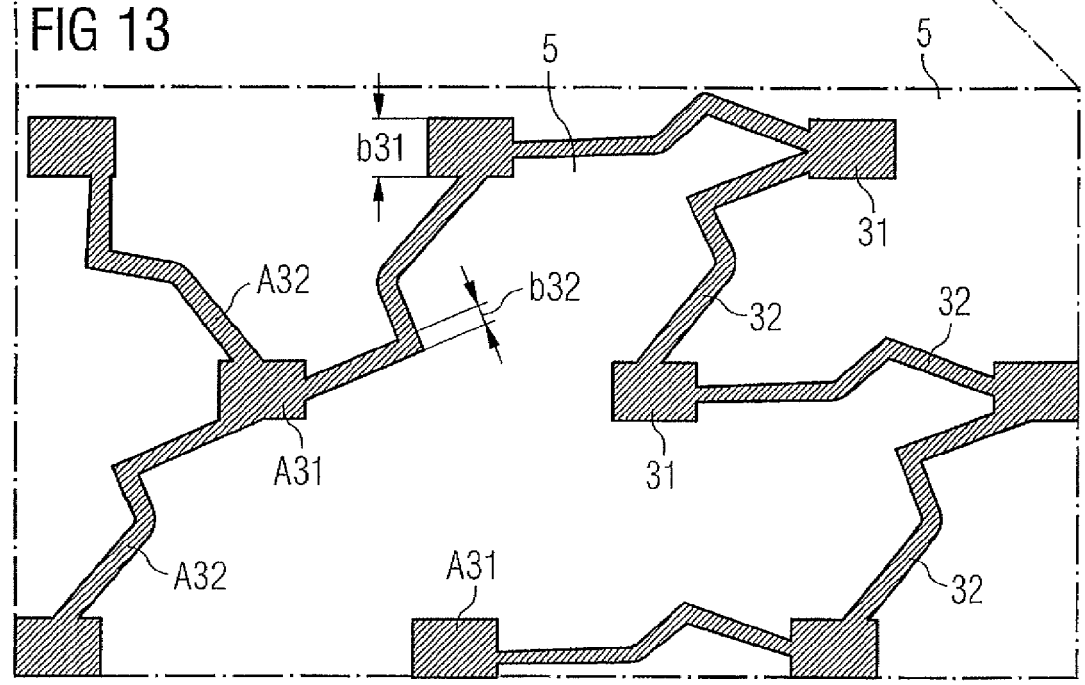
FIG. 13 is a magnified detail of the assembly as shown in FIG. 12.

Referring now to FIG. 12 as well as to FIG. 13 showing a magnified detail there is illustrated how the pillars 31 in this assembly may comprise, for example, also rectangular cross-sectional areas. As evident from this example each of the bonding webs 32 may also comprise two or more straight portions oriented at an angle other than 0° and other than 180° to each other parallel to the bottom side 20b of the insulation carrier 20.

Figure 14:
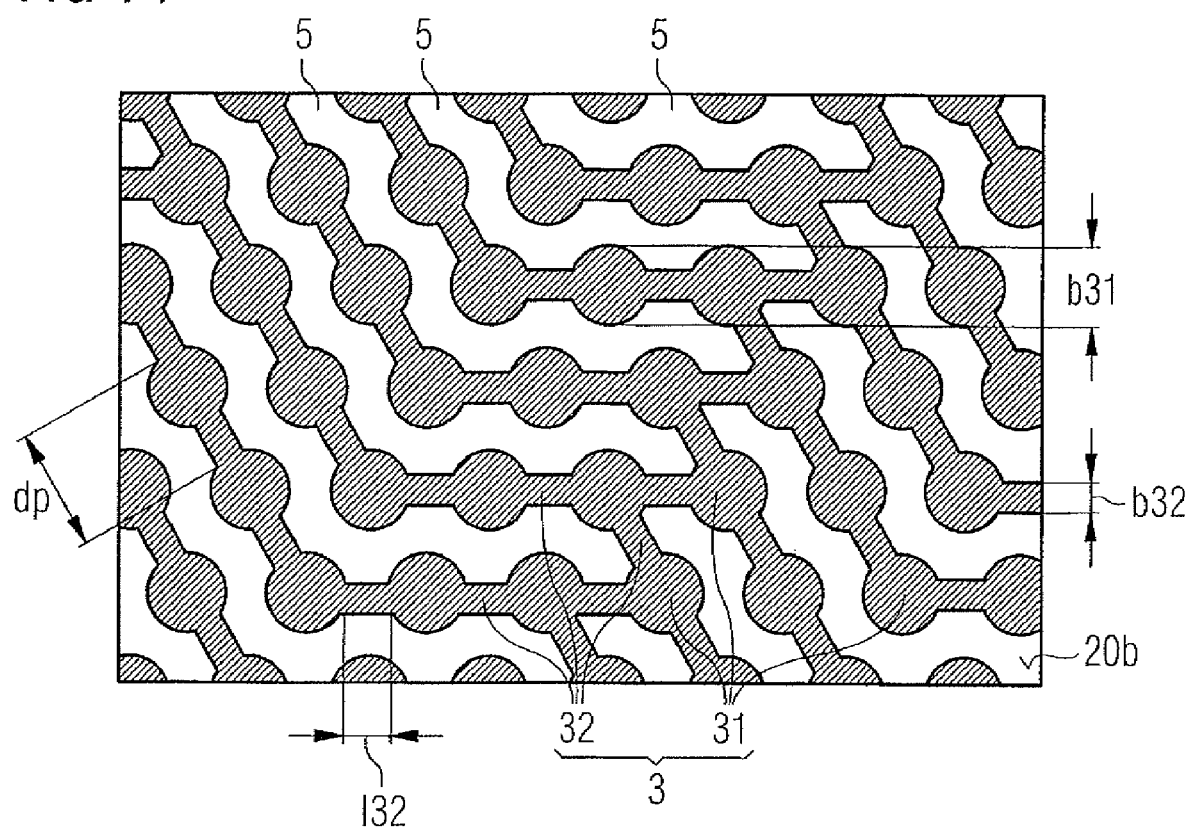
FIG. 14 is a horizontal section through a further anchoring structure bonded to an insulator.

In accordance with a further configuration as shown in FIG. 14 the pillars 31 may be formed cylindrical and comprise circular cross-sectional areas. In this arrangement the anchoring structure 3 may comprise sub-structures in which pillars 31, together with longitudinal webs 33 disposed in between, form bands. The anchoring structure 3 materializes in this arrangement by bonding several such bands by means of further webs 32.

In a departure from the configurations as shown, the pillars 31 may also comprise cross-sectional areas other than square, rectangular or circular, for instance, hexagonal, oval or triangular. Indeed, the cross-sectional areas may take any shape. In addition, diversely shaped pillars 31 may be employed intercombined in an anchoring structure 3.

Referring now to FIG. 15 there is illustrated a top-down view of the bottom side 20b of an insulating substrate 2 provided with an anchoring structure 3 as shown in FIG. 4. The pillars 31 are distributed over the full bottom metallization layer 21 in directions perpendicular to the longitudinal centerline of the pillars 31, this applies the same to the assembly as shown in FIG. 16 in which, however, the corners of the insulating substrate 2 are slanted, as a result of which the thermomechanical stress usually occurring in the corner regions of insulating substrate 2 is reduced.

Referring now to FIG. 17 there is illustrated how the insulating substrate 2 also comprises slanted corners, it differing from insulating substrates 2 as shown in FIGS. 10, 12, 15 and 16, among other things, by the anchoring structure 3 no longer extending over the full main surface area of the bottom metallization layer 21 but just along the side outer edge of the annular edge strip of the bottom metallization layer 21. Within the annular edge strip the insulating substrate 2 comprises a flat surface formed by the portion of the surface of the bottom metallization layer 21 located within the edge strip.

Referring now to FIG. 18 there is illustrated again a top-down view of the bottom metallization layer 21 of an insulating substrate 2. The anchoring structure 3 comprises a number of longitudinal webs 33 which may be likewise configured with or bonded to the bottom metallization layer 21 as explained above for the bottom metallization layer 21. Such longitudinal webs 33 may comprise e.g. lengths l33 ranging from 300 m to 2 mm, and/or heights (corresponding to lengths l31) ranging from 200 µm to 500 µm. Basically, pillars 31 may also be provided in combination with such longitudinal webs 33.

Figure 19:
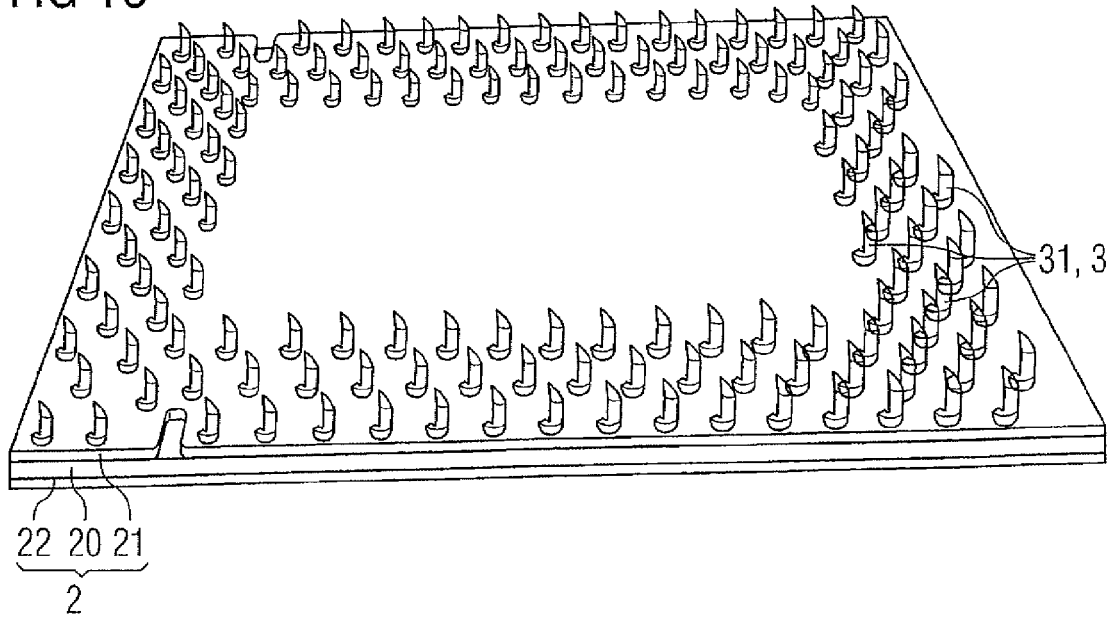
FIG. 19 is a view in perspective of a ceramic substrate comprising a metallization to which bond wire portions are bonded to form an anchoring structure.
Figure 20:
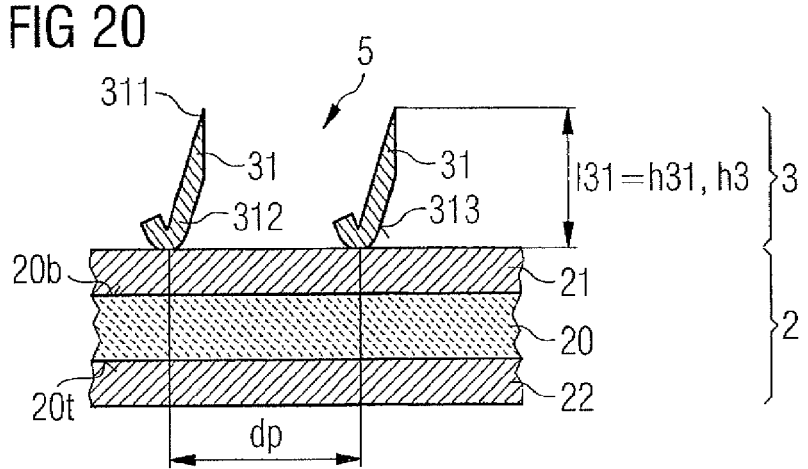
FIG. 20 is a vertical section through a portion of the ceramic substrate as shown in FIG. 19.

Referring now to FIG. 19 there is illustrated a view in perspective of a ceramic substrate 2 bottomed by a bottom metallization layer 21 facing upwards. Applied to the bottom metallization layer 21 is an anchoring structure 3 in which the pillars 31 are formed by bond wire portions, each of which is bonded at one end 312 to the bottom metallization layer 21 whilst the other end 311 is freely spaced away from the bottom metallization layer 21. In producing this structure first the end 312 of the bond wire is bonded to the bottom metallization layer 21 and then cut off with the cutter tool of the bonder or notched with the cutter tool of the bonder and then cut off. The bond wire portions, which serve as pillars 31, are arranged, for example, within an edge strip running along the side edge of the bottom metallization layer 21, as already explained with reference to FIG. 17. Referring now to FIG. 20 there is illustrated magnified a vertical section through two adjoining such pillars 31 which are height h31 high viewed as being the length l31 of the pillar 31 in the sense of the length l31 already explained with reference to FIGS. 2, 4, 5, 6. Width b31 designates the diameter of the bond wire outside of the bonds.

Figure 21:
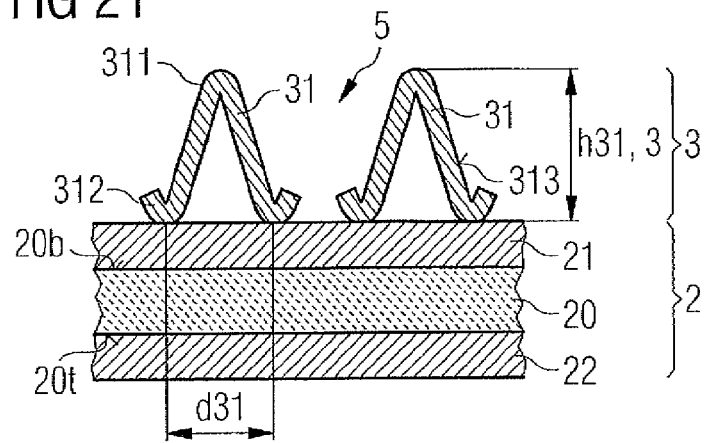
FIG. 21 is a vertical section through an alternative aspect of an anchoring structure produced by means of a bonding technique.

Referring now to FIG. 21 there is illustrated how in an alternative aspect the same bond wire portion 31 may also be bonded to the bottom metallization layer 21 at two locations spaced away from each other by the center-spacing d31. In this arrangement the center-spacing d31 of two adjoining bonds at which a bond wire portion 31 is bonded to the bottom metallization layer 21 may be smaller than the height h31 of a loop of this bond wire portion formed between these two locations. Furthermore, the diameter of the bond wire portion 31 outside of the bonds may range from module 100 µm to 1 mm.

Figure 22:
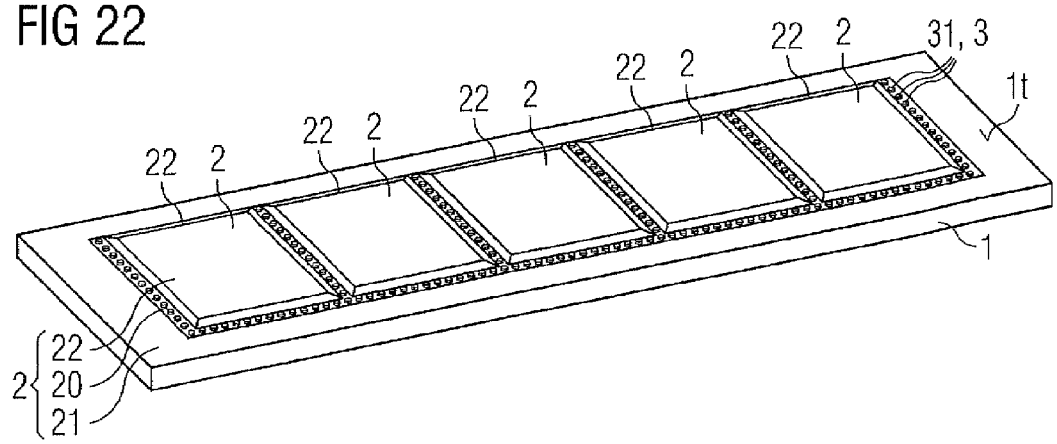
FIG. 22 is a view in perspective of a metal plate to which several cross-sections each spaced away from each other are bonded by means of a common front guide structure.

Referring now to FIG. 22 there is illustrated, by way of an example in a view in perspective of a circuit substrate 1, how in a departure from the examples as explained hitherto in which each anchoring structure 3 was assigned to precisely one insulating substrate 2, an anchoring structure 3 is now provided common to all insulating substrates 2 between several insulating substrate 2 spaced away from each other, on the one hand, and the circuit substrate 1, on the other. One such anchoring structure 3 may be structured, for example, with a network of pillars 31 and bonding webs 32 as shown e.g. in FIGS. 10, 11, 12, 13, 14 or e.g. as a woven network. Likewise, the bottom metallization layer 21 of the insulating substrate 2 may be formed by portions of a fully continuous metalized film which is first provided with an anchoring structure 3 on one of its main surface areas, for example, by embossing, and with the other main surface area thereof the insulation carrier 20 optionally already featuring their top metallization layer 22 and componented with one or more semiconductor chips are connected. Preferably the method as explained with reference to FIG. 7 is made use of in this example in which the solder is disposed between the anchoring structure 3 and the circuit substrate 1 to flow bottom up into the interstices and—should the anchoring structure 3 not already be bonded to the bottom metallization layer 21 or configured in one piece therewith—up to the gap between the bottom metallization and the anchoring structure 3 so that, as already explained, a high-strength alloy materializes.

Irrespective of how the anchoring structure 3 is configured its height h3 may exceed 100 m, for example, in ranging e.g. from 300 µm to 5 mm.

Furthermore, an anchoring structure 3 may be made e.g. of copper, no matter how it is configured. Optionally an anchoring structure 3 may comprise a coating of Ag, Ni/Au, Ni/Pd, Ni/Pd/Au in a thickness ranging e.g. from 2 µm to 10 µm.

Suitable solder 4 for producing the bond between a circuit substrate 1 and an insulating substrate 2 are e.g. all solders having a significant percentage of tin, including, for example: SnSb5; SnAg3.5; SnAg3.5Cu0.5; SnAg3.5Cu0.7; SnAg20, J, K or L alloys, or generally SnxAgy, SnxAgyCuz, SnxCuy.

Referring still to FIG. 22 it is evident how the anchoring structure 3 may extend on all sides beyond the bottom of the bottom metallization layer 21 facing the metal surface It of the circuit substrate 1 as is also optionally possible for anchoring structures 3 mounting just one circuit substrate. Extending the circuit substrate or metallization coverage on all sides additionally optimizes handling the mechanical stress at the edges and corners of the insulating substrate 2.

Figure 23:
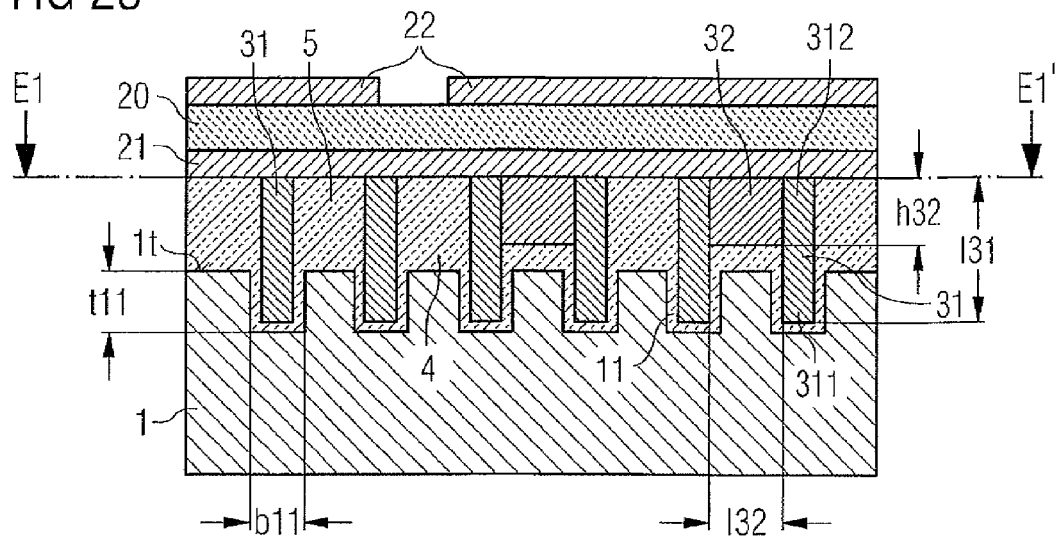
FIG. 23 is a vertical section through a portion of an assembly in which the anchoring structure comprises rod-shaped pillars having free ends arranged to nest in corresponding hollows configured in the circuit substrate.

Referring now to FIG. 23 there is illustrated a further development of the bonding technique as described above, whereby the circuit substrate 1 now features hollows 11 nesting the free ends 311 of pillars 31 where they are soldered to the circuit substrate 1. These hollows 11 may, for example, comprise a depth t11 ranging from 200 µm to 3 mm and/or a width b11 which is at least 0.1 µm larger than the width or diameter width b31 of the pillars 31. As explained above, these pillars 31 may be bonded by means of bonding webs 32 having a length l32 and extending between the sidewalls of two adjoining pillars 31.

Figure 24:
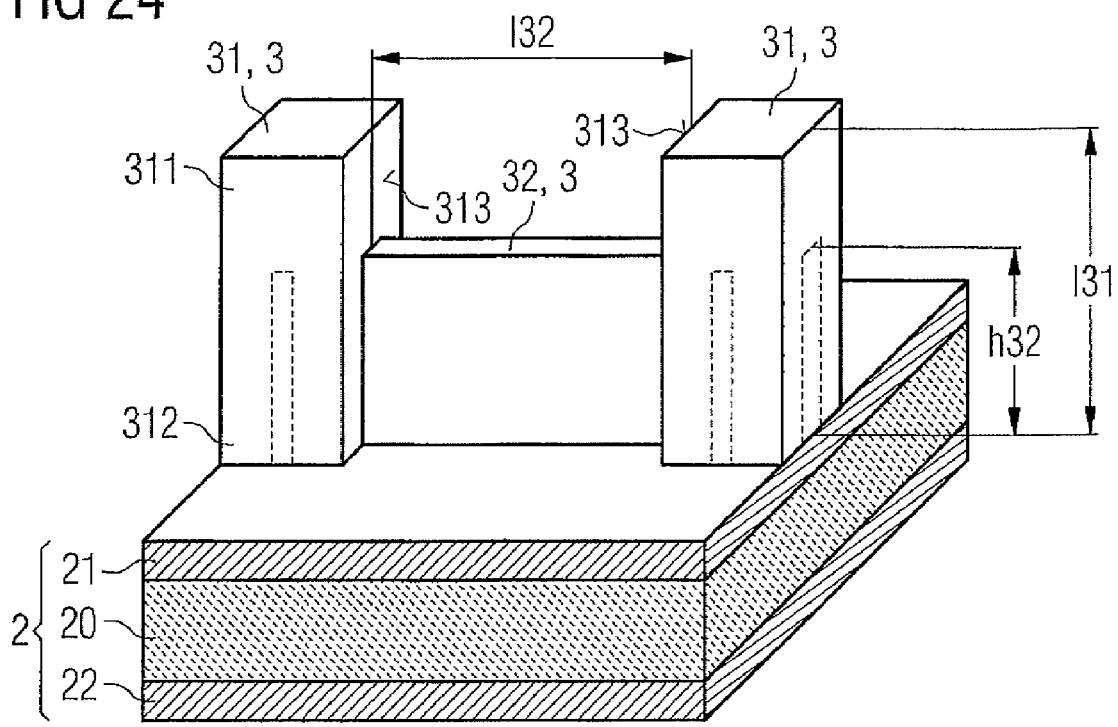
FIG. 24 is a view in perspective of a portion of an insulator provided with an anchoring structure in which two adjoining square cross-sectional pillars are joined by means of a web.

Referring now to FIG. 24 there is illustrated a view in perspective of a portion of an insulating substrate 2 provided with an anchoring structure 3 in which two square cross-sectional adjoining pillars 31 are bonded by means of a web 32. This view makes it clearly evident how the webs 32 extend between the sidewalls 313 of two adjoining pillars 31, the broken lines indicating that also two or more bonding webs 32 may extend from or end at a pillar 31. It is just as possible that a pillar 31 is not provided with bonding webs 32 and is fixedly located only by its ends 312 facing away from the free end 311.

Figure 25:
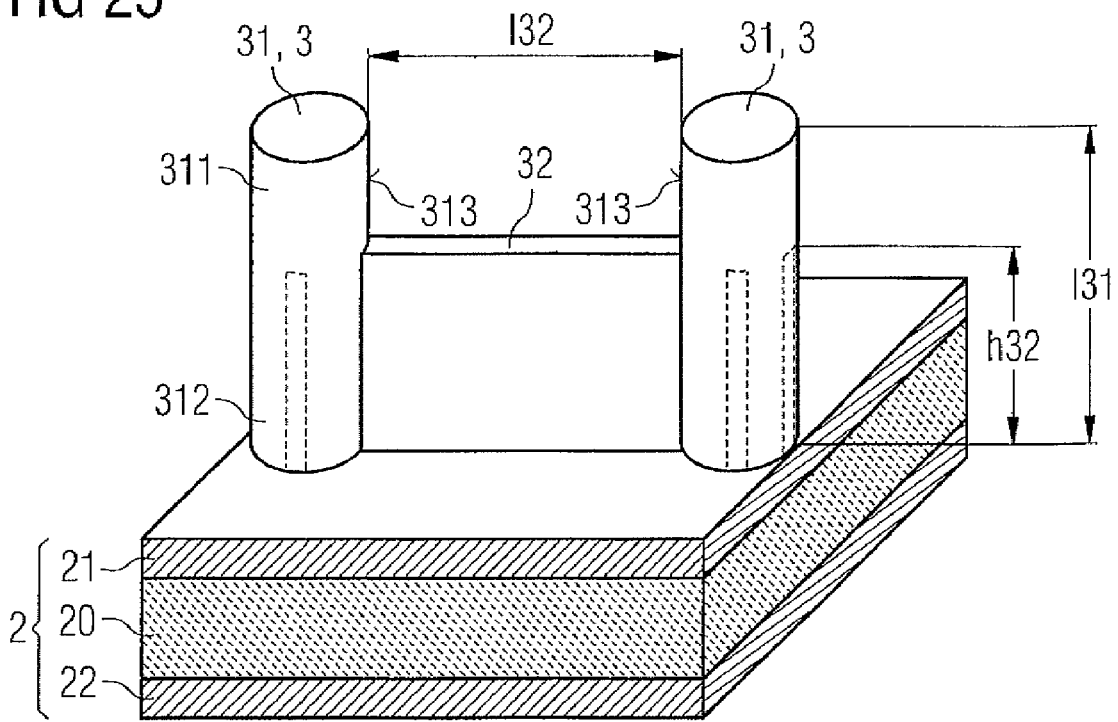
FIG. 25 is a view of an assembly corresponding to that as shown in FIG. 24 except that the pillars instead of having a square cross-section now have a circular cross-section.
Figure 26:
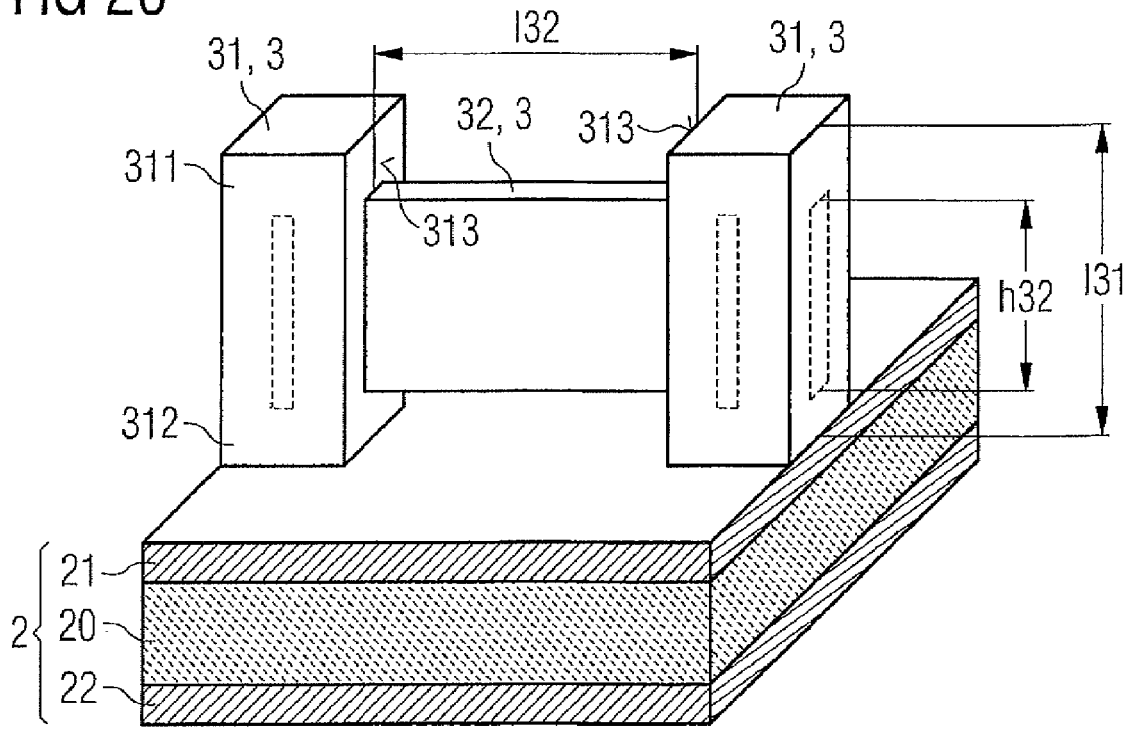
FIG. 26 is a view of an assembly corresponding to that as shown in FIG. 24 except that the webs are spaced away from both edges of the pillars.

Referring now to FIG. 25 there is illustrated an assembly corresponding to that as shown in FIG. 24 except that the pillars 31 now have a circular cross-section instead of a square cross-section.

Figure 27:
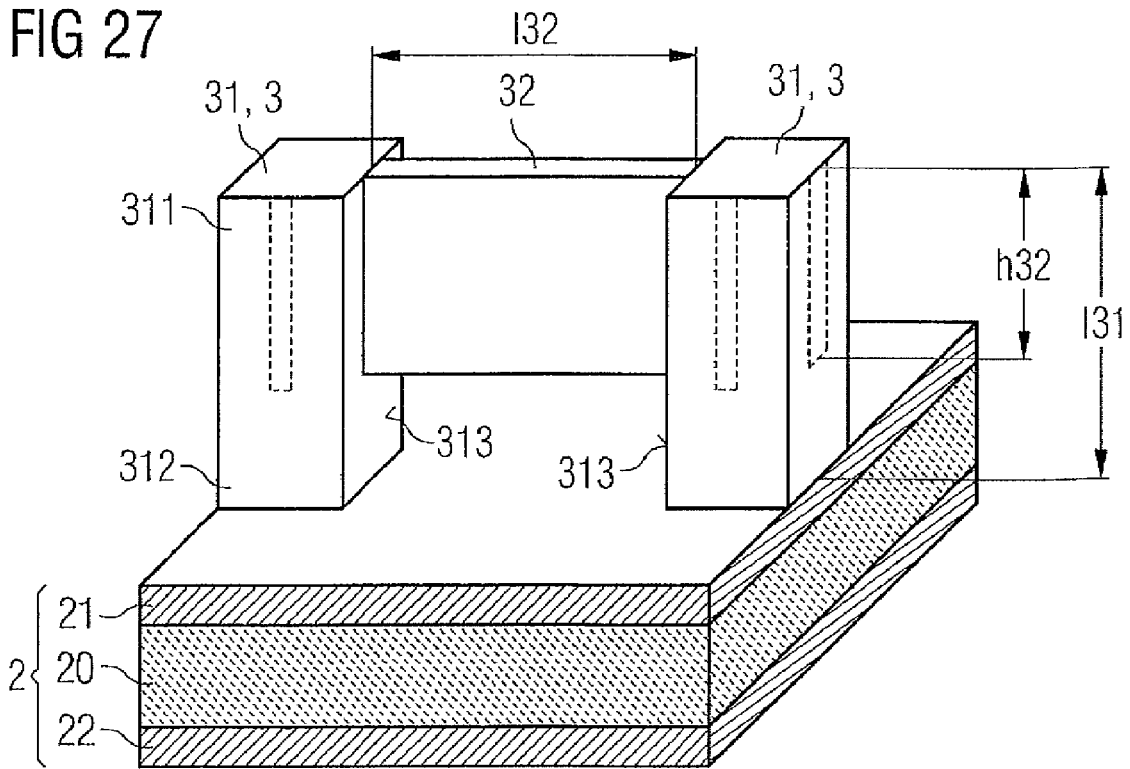
FIG. 27 is a view of an assembly corresponding to that as shown in FIGS. 24 and 26 except that the webs are now arranged coincident with the pillar sides facing away from the insulator.

In the anchoring structures 3 as shown in FIGS. 24 and 25 the webs 32 are arranged flush with the ends 312 of the pillars 31 facing the insulating substrate 2. In a departure therefrom, however, the bonding webs 32 may be spaced away from both the ends 311 facing away from the insulating substrate 2 as well as from the ends 312 of the pillars 31 facing the insulating substrate 2 as is illustrated in FIG. 27, for example, by way of pillars 31 having a rectangular cross-section. Likewise possible, the bonding webs 32 may also be arranged flush with the ends 311 of the pillars 31 facing away from the anchoring structure 3, as is evident from FIG. 28 by way of pillars 31 having a rectangular cross-section, for example.

Referring now to FIG. 28 there is illustrated a vertical cross-sectional view of a power semiconductor module 100, which, as described above, comprises an insulating substrate 2 whose bottom metallization layer 21 is soldered to a circuit substrate 1 using a solder 4 by means of an anchoring structure 3. The module 100 comprises a package 6 with an electrically insulating frame 61 on all sides as well as a package cover 62. The circuit substrate 1 is configured as a metal base plate, representing the bottom package wall of the module 100. The baseplate may range from 0.1 mm to 20 mm thick.

Mounted on the top metallization layer 22 of the insulating substrate 2 are several power semiconductor chips 8 connected thereto by means of a bonding layer 81, for example of solder, an electrically conductive adhesive or a silver pressure sintered bond. The power semiconductor chips may be, for example, a gatable power semiconductor such as, for example, MOSFETs, IGBTs, thyristors, JFETs or power diodes. The power semiconductor chips 8 are semiconductor chips featuring high nominal currents exceeding 50 A or 75 A and/or high nominal voltages exceeding 400 V, for example. In addition, the power semiconductor chips may be sized to exceed 5.5 by 5.5 mm or 7 by 7 mm.

The power semiconductor chips 8 are topped by the electric circuitry thereof with portions of the top metallization layer 22 by means of bond wires 82. Instead of bond wires 82 metal clips may also be provided, for example, electrically conductively connected to the top of the chips and/or the top metallization layer 22 by soldering, by electrically conductive adhesive bonding or silver pressure sintered bonding.

To connect the power semiconductor module 100 externally to, for example, a power supply, a load, a controller, etc, electric terminals 91, 92, 93, 94 are provided, the electric terminals 91, 92 of which may be configured, for example, to make the power supply connection and electrically and/or mechanical bonded to the portions 221, 222, 223, 224, 225, 226 of the top metallization layer 22. Power supply terminals may also be positioned in the frame of the package wire-bonded to the top metallization layer 22. The terminals 93, 94 may be configured as gating terminals, for instance, for one or more of the power semiconductor chips 8 or as output terminals for outputting signals presenting information as to the status of the power semiconductor module 100.

The power semiconductor chip 8 is topped by an optional printed circuit board (PCB) 95 for circuiting internal driver terminals. The PCB 95 may also be componented with electronics to gate the gatable chips of the power semiconductor chip 8. Power semiconductor modules sophisticated with gating electronics are also termed "intelligent" (IPMs).

To boost the dielectric strength the bottom of the circuit substrate 1 is potted with an optional potting compound 51, for instance a silicon gel extending, for example, in the longitudinal centerline v from the insulating substrate 2 at least beyond the power semiconductor chip 8 or the bond wires 82, for instance, as far as the printed circuit board 95. The potting compound 51 is topped by an optional rigid potting compound 52, for example an epoxy resin, to electrically insulate the electric terminals 91, 92, 93, 94 and the 92 for added mechanical stability.

Referring still to FIG. 28 there is illustrated how the anchoring structure 3 may cover the bottom metallization layer 21 of the insulating substrate 2 in its entirety. But, basically, any other assembly—for example, any of the assemblies as shown in FIGS. 10, 12, 5, 16, 17, 18, 19—can come into consideration for the geometry of the anchoring structure 3.

To fabricate the power semiconductor module 100 the power semiconductor chips 8 can be solidly bonded to the top metallization layer 22 before the metal surface It is soldered to the bottom metallization layer 21 and to the anchoring structure 3. The composite formed by soldering the metal surface It to the bottom metallization layer 21 and anchoring structure 3 can then be furnished with the electric terminals 91, 92, 93, 94 and the proper electric functioning of the resulting module tested. When tested positive the module can be inserted in the frame 61 or the module package 6 in its entirety and then potted with the potting compounds 51 and 52. It is an advantage when this module is provided with electric terminals before being inserted in the frame 61 or module package 6 to then test the resulting module for proper electric functioning. For, should the module test negative it can be replaced, before being installed in the module package 6, by a proper functioning module. It is furthermore an advantage when the module once installed is not exposed to temperatures exceeding 400° C.

Referring now to FIG. 29 there is illustrated a further example for a possible assembly of the anchoring structure 3 in a power semiconductor module 100 in which the anchoring structure 3 bottoms the power semiconductor chips 8 just locally, i.e. below the locations at the highest temperatures occur. This is an advantage when the power semiconductor chips 8 are spaced away from the edges of the circuit substrate at a greater distance where the swing in the change of temperature in operation of the assembly is smaller than in the region of the power semiconductor chips 8. In addition, this structure is an advantage when the circuit substrate 1 is made of a MMC material, such as AlSiC. For, then, the thermal coefficient of expansion of the circuit substrate 1 and of the insulation carrier 20 can be better matched whilst the thermal coefficient of expansion of the solder 4 is far removed from the other thermal coefficients of expansion which in the absence of an anchoring structure 3 would result in the fatigue of the solder being much higher than with the anchoring structure 3 provided.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for fabricating a circuit substrate arrangement comprising:
   providing a circuit substrate comprising a metal surface;
   providing an insulating substrate comprising an insulation carrier featuring a bottom side provided with a bottom metallization layer;
   providing an anchoring structure comprising a plurality of oblong pillars each featuring a first end facing away from the insulation carrier, at least a subset of the oblong pillars being distributed over the anchoring structure in its entirety, at least some of the pillars of the subset being bonded by one to four elongated bonding webs to one or more adjoining oblong pillars;
   positioning the anchoring structure between the insulation carrier and the metal surface; and
   subsequently soldering the metal surface to the bottom metallization layer and the anchoring structure by means of a solder packing all interstices between the metal surface and the bottom metallization layer with the solder.

2. The method as set forth in claim 1 wherein the anchoring structure, before soldering the metal surface to the bottom metallization layer, is configured as an element independent of the bottom metallization layer.

3. The method as set forth in claim 2 wherein the anchoring structure, before soldering of the metal surface to the bottom metallization layer, is bonded to the bottom metallization layer.

4. The method as set forth in claim 2 wherein the anchoring structure, before soldering the metal surface to the bottom metallization layer, is configured as a flat network or as a perforated, etched or punched metalized film.

5. The method as set forth in claim 1 wherein the anchoring structure comprises a plurality of bond wire portions, each of which is bonded by at least two bonds to the bottom metallization layer, each bond wire portion forming a loop between two adjoining bonds.

6. The method as set forth in claim 5 wherein a center-spacing between two adjoining bonds is smaller than a height of the loop formed between the bonds.

7. The method as set forth in claim 1 wherein the anchoring structure, before soldering the metal surface to the insulating substrate, is configured in one piece with the bottom metallization layer and is made of the same material.

8. The method as set forth in claim 7 wherein the anchoring structure is produced in that the bottom metallization layer before or after being bonded to the insulation carrier is provided as a metalized film having a predefined film thickness, and that the pillars are produced by etch patterning the metalized film down to a predefined etching depth, the predefined etching depth being smaller than the predefined film thickness.

9. The method as set forth in claim 8 wherein the predefined film thickness ranges from 400 μm to 1 mm.

10. The method as set forth in claim 8 wherein the predefined etching depth ranges from 200 μm to 700 μm.

11. The method as set forth in claim 7 wherein
the anchoring structure, before soldering the metal surface to the bottom metallization layer, comprises a plurality of pillars the first end of which, except for any bonding webs, is configured as a free end;
the bottom metallization layer comprises a portion configured as a flat continuous layer configured in one piece with the pillars in interbonding same by their second ends facing away from the first ends.

12. The method as set forth in claim 1 wherein each pillar extends in a longitudinal centerline oriented after soldering of the metal surface to the bottom metallization layer perpendicular to the bottom side of the insulation carrier.

13. The method as set forth in claim 1 wherein the anchoring structure comprises one or more longitudinal webs which run parallel to the bottom side of the insulation carrier;
relative to the side of the bottom metallization layer facing away from the insulation carrier comprise a height ranging from 200 μm to 500 μm; and
comprise a length ranging from 300 μm to 2 mm.

14. The method as set forth in claim 1 wherein the anchoring structure comprises, in a section plane parallel to the bottom side of the insulation carrier, a total cross-sectional area amounting to at least 10% of the surface area of the top side of the bottom metallization layer bonded to the insulation carrier.

15. The method as set forth in claim 1 wherein the anchoring structure comprises a height of more than 100 μm.

16. The method as set forth in claim 1 wherein the anchoring structure comprises a height perpendicular to the bottom side of the insulation carrier ranging from 200 μm to 5 mm.

17. The method as set forth in claim 1 wherein the anchoring structure comprises a height perpendicular to the bottom side of the insulation carrier ranging from 300 μm to 1 mm.

18. The method as set forth in claim 1 wherein the insulation carrier is formed of an electrically insulating ceramic.

19. The method as set forth in claim 1 wherein before soldering the metal surface to the bottom metallization layer the anchoring structure is tempered at a temperature of more than 350° C.

20. The method as set forth in claim 1 wherein an end of the anchoring structure facing the metal surface is nested in one or more corresponding hollows of the circuit substrate before soldering the metal surface to the bottom metallization layer.

21. The method as set forth in claim 1 wherein the first ends of the pillars are configured as free ends which are nested in corresponding hollows of the circuit substrate before soldering the metal surface to the bottom metallization layer.

22. The method as set forth in claim 21 wherein the corresponding hollows range in depth from 200 μm to 3 mm.

23. The method as set forth in claim 1 wherein:
the insulating substrate comprises a top metallization layer arranged at top side of the insulation carrier facing away from the bottom metallization layer, and on which at least one power semiconductor chip is arranged; and
producing a module package housing at least one power semiconductor chip and the insulating substrate, the circuit substrate forming a baseplate of the power semiconductor module.

24. The method as set forth in claim 23 wherein at least one power semiconductor chip, before soldering the metal surface to the bottom metallization layer and to the anchoring structure, is solidly bonded to the top metallization layer.

\* \* \* \* \*